(12) United States Patent
Bulea

(10) Patent No.: US 9,188,675 B2
(45) Date of Patent: Nov. 17, 2015

(54) SYSTEM AND METHOD FOR SENSING MULTIPLE INPUT OBJECTS WITH GRADIENT SENSOR DEVICES

(75) Inventor: Mihai Bulea, Santa Clara, CA (US)

(73) Assignee: Synaptics Incorporated, San Jose, CA (US)

( * ) Notice: Subject to any disclaimer, the term of this patent is extended or adjusted under 35 U.S.C. 154(b) by 824 days.

(21) Appl. No.: 13/429,137

(22) Filed: Mar. 23, 2012

(65) Prior Publication Data
US 2013/0253863 A1    Sep. 26, 2013

(51) Int. Cl.
*G06F 19/00* (2011.01)
*G01S 17/42* (2006.01)
*H03K 17/955* (2006.01)
*G01S 15/42* (2006.01)
*G06F 3/044* (2006.01)

(52) U.S. Cl.
CPC ............ *G01S 17/42* (2013.01); *G01S 15/42* (2013.01); *G06F 3/044* (2013.01); *H03K 17/955* (2013.01); *G06F 2203/04101* (2013.01); *G06F 2203/04104* (2013.01); *G06F 2203/04108* (2013.01); *H03K 2217/96066* (2013.01)

(58) Field of Classification Search
CPC ............ G06F 2203/04101; G06F 2203/04102; G06F 2203/04104; G06F 2203/04106; G06F 2203/04108; G06F 2203/04111–2203/04113; G06F 3/044
USPC .......................................................... 702/65
See application file for complete search history.

(56) References Cited

U.S. PATENT DOCUMENTS

| | | | |
|---|---|---|---|
| 4,087,625 A | 5/1978 | Dym et al. | |
| 5,650,597 A | 7/1997 | Redmayne | |
| 5,841,078 A | 11/1998 | Miller et al. | |
| 5,844,078 A | 12/1998 | Niddam et al. | |
| 5,940,065 A * | 8/1999 | Babb et al. | 345/178 |
| 6,278,444 B1 | 8/2001 | Wilson et al. | |
| 6,288,707 B1 | 9/2001 | Philipp | |
| 6,879,930 B2 | 4/2005 | Sinclair et al. | |
| 7,030,860 B1 | 4/2006 | Hsu et al. | |
| 7,265,686 B2 | 9/2007 | Hurst | |
| 7,355,592 B2 | 4/2008 | Hong et al. | |
| 7,382,139 B2 | 6/2008 | Mackey | |
| 7,423,635 B2 | 9/2008 | Taylor et al. | |
| 7,737,953 B2 | 6/2010 | Mackey | |
| 7,808,255 B2 | 10/2010 | Hristov et al. | |

(Continued)

OTHER PUBLICATIONS

"X-wire resistive multi-touch screens", May 2008, SiMa Systems, Inc., http://www.simasystems.com/file_download/x-wire_resistive_multi_touch_screen.pdf.*

(Continued)

*Primary Examiner* — Edward Raymond
(74) *Attorney, Agent, or Firm* — Osha Liang LLP

(57) ABSTRACT

A processing system for an input device includes a transmitter module including transmitter circuitry, a receiver module, and a determination module. The transmitter module is configured to drive the transmitter electrode with a first drive signal to produce a first voltage gradient across the transmitter electrode, wherein the first voltage gradient is non-linear. The receiver module is configured to receive a first resulting signal with a receiver electrode, the resulting signal comprising effects of the first voltage gradient. The determination module is configured to determine positional information for a plurality input objects located simultaneously within a sensing region along the transmitter electrode based on the first resulting signal.

11 Claims, 10 Drawing Sheets

(56) References Cited

U.S. PATENT DOCUMENTS

| | | | |
|---|---|---|---|
| 8,248,383 B2 | 8/2012 | Dews et al. | |
| 2004/0061687 A1* | 4/2004 | Kent et al. | 345/173 |
| 2004/0135775 A1 | 7/2004 | Hurst et al. | |
| 2005/0012644 A1* | 1/2005 | Hurst et al. | 341/33 |
| 2006/0097991 A1* | 5/2006 | Hotelling et al. | 345/173 |
| 2007/0146349 A1 | 6/2007 | Errico | |
| 2007/0222763 A1 | 9/2007 | Spath | |
| 2007/0247443 A1 | 10/2007 | Philipp | |
| 2007/0257894 A1 | 11/2007 | Philipp | |
| 2008/0006453 A1 | 1/2008 | Hotelling | |
| 2008/0246496 A1 | 10/2008 | Hristov et al. | |
| 2009/0091551 A1 | 4/2009 | Hotelling et al. | |
| 2009/0194344 A1 | 8/2009 | Harley et al. | |
| 2009/0267914 A1* | 10/2009 | Dews et al. | 345/173 |
| 2009/0277696 A1* | 11/2009 | Reynolds et al. | 178/18.06 |
| 2009/0322355 A1 | 12/2009 | Day et al. | |
| 2010/0007625 A1 | 1/2010 | Jiang et al. | |
| 2010/0045632 A1 | 2/2010 | Yilmaz et al. | |
| 2010/0164889 A1 | 7/2010 | Hristov et al. | |
| 2010/0214231 A1 | 8/2010 | D'Souza et al. | |
| 2010/0258360 A1 | 10/2010 | Yilmaz | |
| 2010/0328255 A1 | 12/2010 | Ishizaki et al. | |
| 2011/0043478 A1 | 2/2011 | Matsushima | |
| 2011/0048813 A1 | 3/2011 | Yilmaz | |
| 2011/0062969 A1* | 3/2011 | Hargreaves et al. | 324/658 |
| 2011/0062974 A1* | 3/2011 | Day et al. | 324/713 |
| 2013/0249850 A1* | 9/2013 | Bulea | 345/174 |
| 2013/0328821 A1* | 12/2013 | Bulea | 345/174 |

OTHER PUBLICATIONS

United States Patent and Trademark Office, Non-Final Office Action mailed Sep. 6, 2012 for U.S. Appl. No. 12/847,598.

United States Patent and Trademark Office, US Non-final Office Action for U.S. Appl. No. 12/879,474, dated Dec. 28, 2012.

USPTO, Ex parte Quayle Office Action for U.S. Appl. No. 12/879,474, mailed May 15, 2013.

ISA/KR "International Search Report and Written Opinion" mailed Apr. 28, 2011 for International Appln. No. PCT/US2010/048319.

* cited by examiner

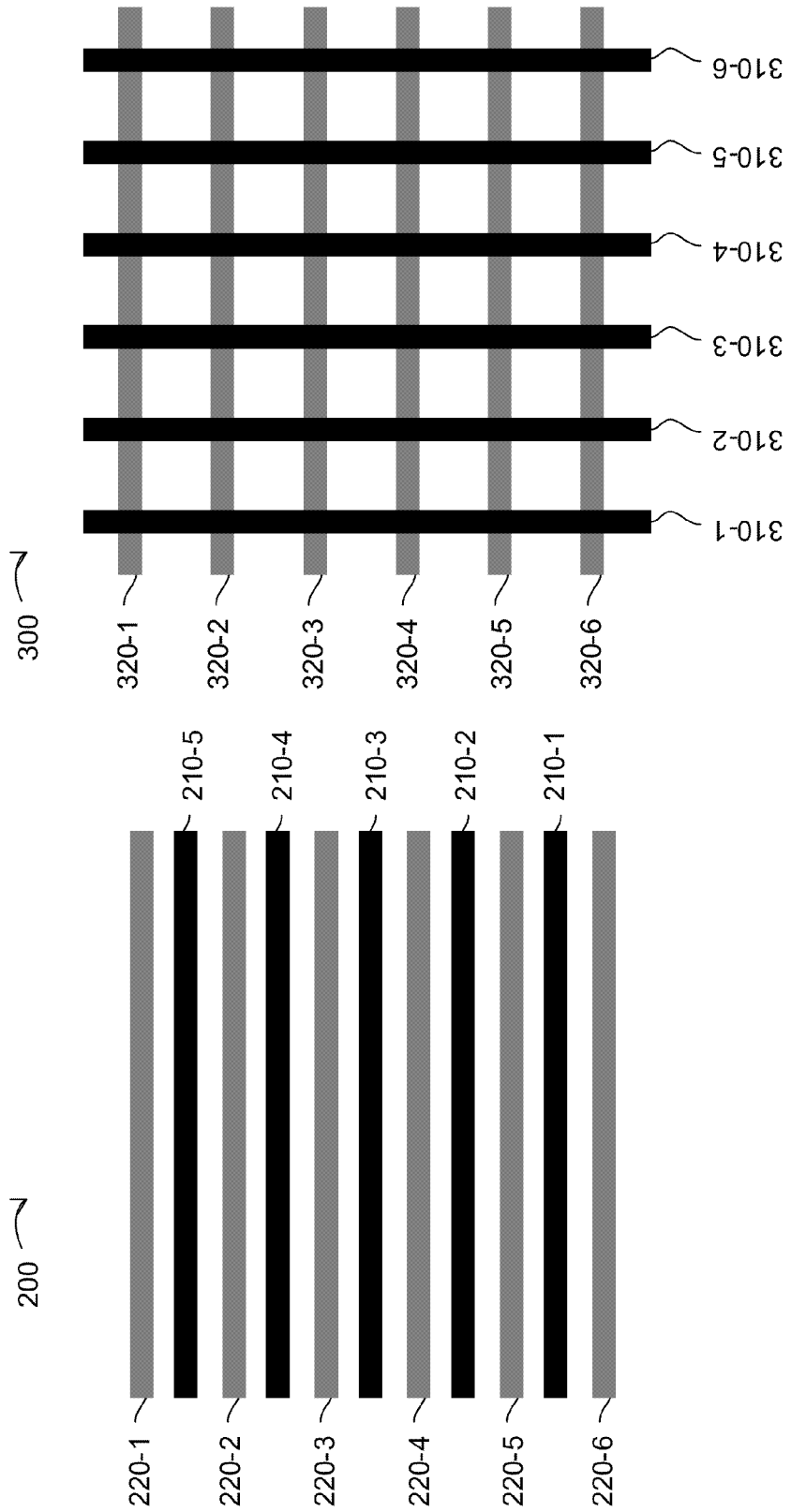

SYSTEM AND METHOD FOR SENSING MULTIPLE INPUT OBJECTS WITH GRADIENT SENSOR DEVICES

FIELD OF THE INVENTION

This invention generally relates to electronic devices, and more specifically relates to sensor devices.

BACKGROUND OF THE INVENTION

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers).

Gradient sensors are sensors that employ a voltage variation across one or more electrodes (usually a transmitter electrode) to assist in determining positional information. While gradient sensors are advantageous in a number of respects, there remains a need for gradient sensors capable of simultaneously sensing more than one input object present within a sensing region.

BRIEF SUMMARY OF THE INVENTION

A processing system in accordance with one embodiment of the present invention includes a transmitter module including transmitter circuitry, a receiver module, and a determination module. The transmitter module is configured to drive the transmitter electrode with a first drive signal to produce a first voltage gradient across the transmitter electrode, wherein the first voltage gradient is non-linear. The receiver module is configured to receive a first resulting signal with a receiver electrode, the resulting signal comprising effects of the first voltage gradient. The determination module is configured to determine positional information for a plurality input objects located simultaneously within a sensing region along the transmitter electrode based on the first resulting signal.

A gradient sensor device in accordance with one embodiment includes a transmitter electrode, a receiver electrode, and a processing system. The processing system is communicatively coupled to the transmitter electrode and the receiver electrode, and is configured to drive the transmitter electrode with a first drive signal to produce a first voltage gradient across the transmitter electrode, wherein the first voltage gradient is non-linear, receive a first resulting signal with the receiver electrode, the resulting signal comprising effects of the first voltage gradient, and determine positional information for a plurality of input objects located simultaneously within a sensing region along the transmitter electrode based on the first resulting signal.

A method of capacitive sensing in accordance with one embodiment includes driving a transmitter electrode with a first drive signal to produce a first voltage gradient across the transmitter electrode, wherein the first voltage gradient is non-linear; receiving a first resulting signal with a receiver electrode, the resulting signal comprising effects of the first voltage gradient; and determining positional information for a plurality input objects located simultaneously within a sensing region along the transmitter electrode based on the first resulting signal.

BRIEF DESCRIPTION OF DRAWINGS

The present invention will hereinafter be described in conjunction with the appended drawings, where like designations denote like elements, and:

FIG. 2 is a conceptual block diagram depicting an example electrode pattern;

FIG. 3 is a conceptual block diagram depicting an example electrode pattern;

DETAILED DESCRIPTION OF THE INVENTION

The following detailed description presents a number of example embodiments and is not intended to limit the invention or the application and uses of the invention. Furthermore, there is no intention to be bound by any expressed or implied theory presented in the preceding technical field, background, brief summary, or the following detailed description.

Figure 1:
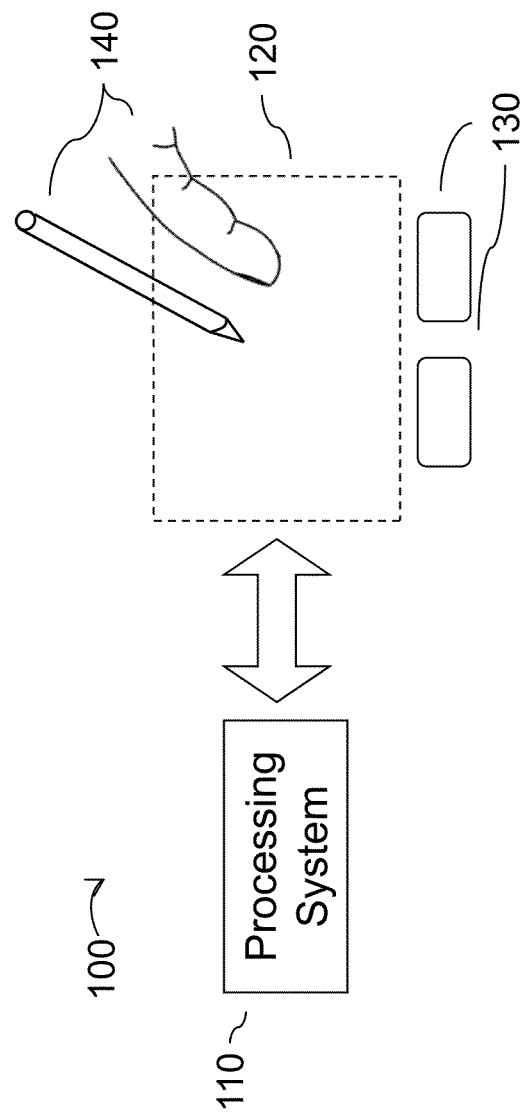
FIG. 1 is a block diagram of an example system that includes an input device in accordance with an embodiment of the invention.

Various embodiments of the present invention provide input devices and methods that facilitate improved usability. FIG. 1 is a block diagram of an example input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be substantially uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

FIGS. 2 and 3 illustrate, conceptually, example sets of capacitive sensor electrodes 200 and 300 configured to sense in a sensing region. For clarity of illustration and description, FIG. 2 shows a pattern of sensor electrodes arranged substantially parallel to each other, and FIG. 3 shows a pattern of sensor electrodes arranged substantially perpendicular to each other. FIG. 2 and FIG. 3 illustrates two different forms of what may be referred to as a "gradient" sensors, in which a voltage variation is produced in the electrodes, as described in further detail below. The embodiment illustrated in FIG. 3 may further be referred to as what is often referred to as an "image" sensor, or a "gradient image sensor". It will be appreciated, however, that the invention is not so limited, and that a variety of electrode patterns and shapes may be suitable in any particular embodiment.

Sensor electrodes 210 and 220 of FIG. 2 are typically ohmically isolated from each other, as are sensor electrodes 310 and 320 of FIG. 3. In some embodiments, such sensor electrodes are separated from each by one or more substrates. For example, they may be disposed on opposite sides of the same substrate, or on different substrates that are laminated together.

In the embodiment depicted in FIG. 2, some sensor electrodes 210 (e.g., 210-1, 210-2, etc.) are configured as receiver electrodes, and some sensor electrodes 220 (e.g., 220-1, 220-2, etc.) are configured as transmitter electrodes. Similarly, in FIG. 3, some sensor electrodes 310 (e.g., 310-1, 310-2, etc.) are configured as receiver electrodes, and some sensor electrodes 320 (e.g., 320-1, 320-2, etc.) are configured as transmitter electrodes. The capacitive coupling between the transmitter electrodes and receiver electrodes change with the proximity and motion of input objects in the sensing region associated with the transmitter electrodes and receiver electrodes.

In each of the illustrated embodiments (as well as other example embodiments) the receiver sensor electrodes may be operated singly or multiply to acquire resulting signals. The resulting signals may be used to determine a "capacitive frame" representative of measurements of the capacitive couplings. Multiple capacitive frames may be acquired over multiple time periods, and differences between them used to derive information about input in the sensing region. For example, successive capacitive frames acquired over successive periods of time can be used to track the motion(s) of one or more input objects entering, exiting, and within the sensing region.

Referring again to FIG. 1, a processing system 110 is shown as part of the input device 100. The processing system 110 is configured to operate the hardware of the input device 100 (including, for example, the various sensor electrodes 200 and 300 of FIGS. 2 and 3) to detect input in the sensing region 120. The processing system 110 comprises parts of or all of one or more integrated circuits (ICs) and/or other circuitry components. For example, as described in further detail below, a processing system for a mutual capacitance sensor device may comprise transmitter circuitry configured to transmit signals with transmitter sensor electrodes, and/or receiver circuitry configured to receive signals with receiver sensor electrodes).

In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like. In one embodiment, processing system 110 includes determination circuitry configured to determine positional information for an input device based on the measurement.

"Positional information" as used herein broadly encompasses absolute position, relative position, velocity, acceleration, and other types of spatial information. Example "zero-dimensional" positional information includes near/far or contact/no contact information. Example "one-dimensional" positional information includes positions along an axis. Example "two-dimensional" positional information includes motions in a plane. Example "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 4:
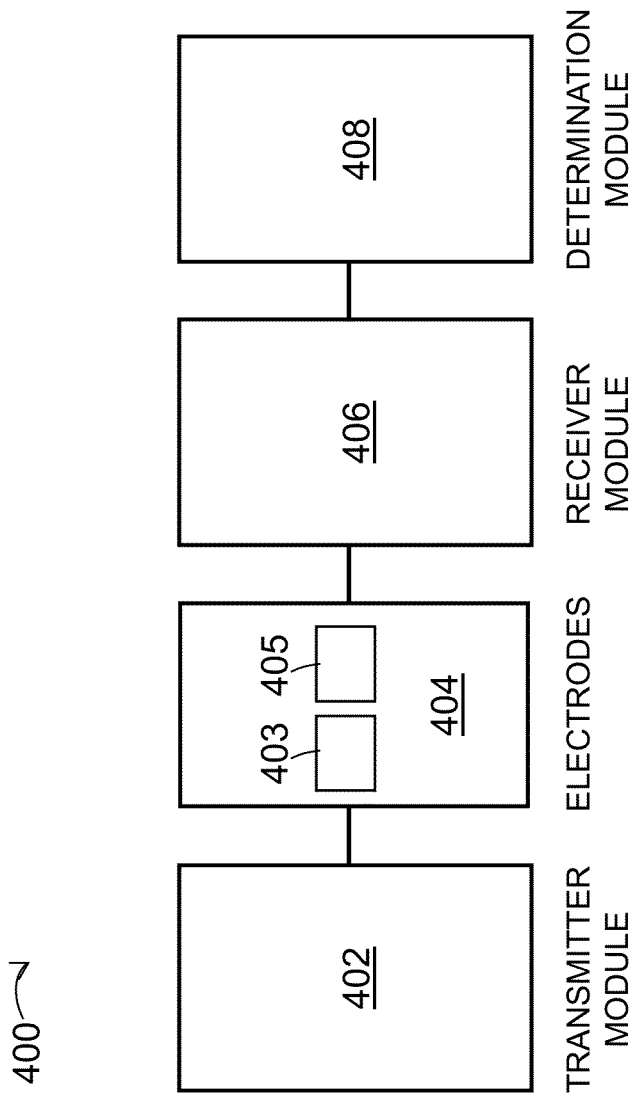
FIG. 4 is a conceptual diagram depicting an example processing system in accordance with the present invention.

Referring now to the conceptual block diagram depicted in FIG. 4, various embodiments of an example processing system 110 as shown in FIG. 1 may include a system 400. System 400, as illustrated, generally includes transmitter module 402 communicatively coupled via a set of sensor electrodes (or simply "sensor electrodes") 404 to receiver module 406, which itself is coupled to determination module 408. Sensor electrodes 404 include one or more transmitter electrodes 403 and one or more receiver electrodes 405. In one embodiment, sensor electrodes 404 may be constructed from opaque or substantially opaque conductive materials. In other embodiments sensor electrodes 404 can be constructed from transparent or substantially transparent conductive material, such as patterned ITO, ATO, carbon fiber nanotubes, or other substantially transparent materials. In one embodiment, transmitter electrodes 403 are constructed from a conductive material of substantially uniform resistivity, so that voltage variations can be imposed on it by the driving methods described below. In some embodiments, the conductive material may have non-uniform resistivity, such as having a higher or lower resistivity on the distal ends than in the middle portion. Other forms of non-uniform resistivity can also be implemented. In one embodiment, the voltage variations may be defined as the amount of change in voltage as a function of a small change in position along a transmitter electrode comprising resistive material.

Transmitter module 402 includes any combination of software and/or hardware (e.g., transmitter circuitry) configured to drive a transmitter electrode 403 with one or more drive signals to produce one or more voltage gradient across transmitter electrode 403, wherein at least one of the gradients is non-linear. In various embodiments, for example, a single voltage gradient, two voltage gradients, or four voltage gradients may be used, as discussed in detail below.

Receiver module 406 includes any combination of software and/or hardware (e.g., receiver circuitry) configured to receive one or more resulting signals with receiver electrodes 405, wherein the resulting signals comprise effects of the voltage gradient produced across transmitter electrode 403. The term "gradient sensor" is thus used herein, without loss of generality, to refer to a sensor device employing one or more such voltage variations as described herein.

Determination module 408 includes any combination of hardware and/or software configured to determine positional information along a transmitter electrode for a plurality of input objects located simultaneously within a sensing region (e.g., input objects 140 within sensing region 120 of FIG. 1), based on the resulting signals received by receiver module 406.

Figure 5:
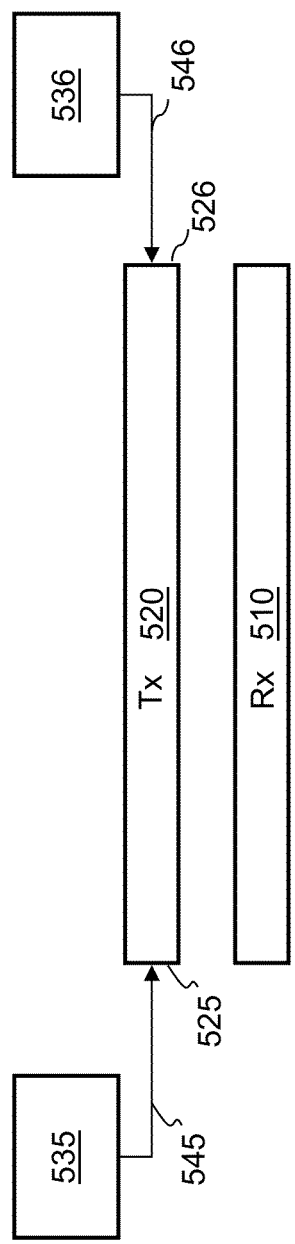
FIG. 5 is a conceptual diagram depicting an example of gradient sensor signaling.

FIG. 5 is a simplified block diagram depicting a transmitter electrode 520, a receiver electrode 510, a first transmitter 535, and a second transmitter 536 in accordance with one embodiment of the invention. In this embodiment, first transmitter 535 drives a first drive signal 545 that is used to drive end 525 of transmitter electrode 520, while second transmitter 536 substantially simultaneously drives a second drive signal 546 on end 526 of first transmitter electrode 520.

"Driving" a signal with respect to a particular end of a transmitter electrode, as used herein, refers to imparting or otherwise causing a series of bursts, pulses or voltage transitions for a period of time. Transmitters 535 and 536 include any combination of hardware and/or software configured to drive signals as described herein. While transmitter electrode 520 and receiver electrode 510 are illustrated as generally rectangular and oriented substantially parallel to each other, the invention is not so limited: sensor electrodes 520 and 510 may have a variety of shapes and orientations. While transmitter electrode 520 is driven by drive signals 545 and 546, a voltage gradient is instantaneously produced across transmitter electrode 520, and changes over time as drive signals 545 and 546 themselves change. In addition, transmitter electrode 520 may be driven with any number of additional drive signals (e.g., a second, third, and fourth drive signal) to produce a corresponding number of voltage gradients.

Figure 6:
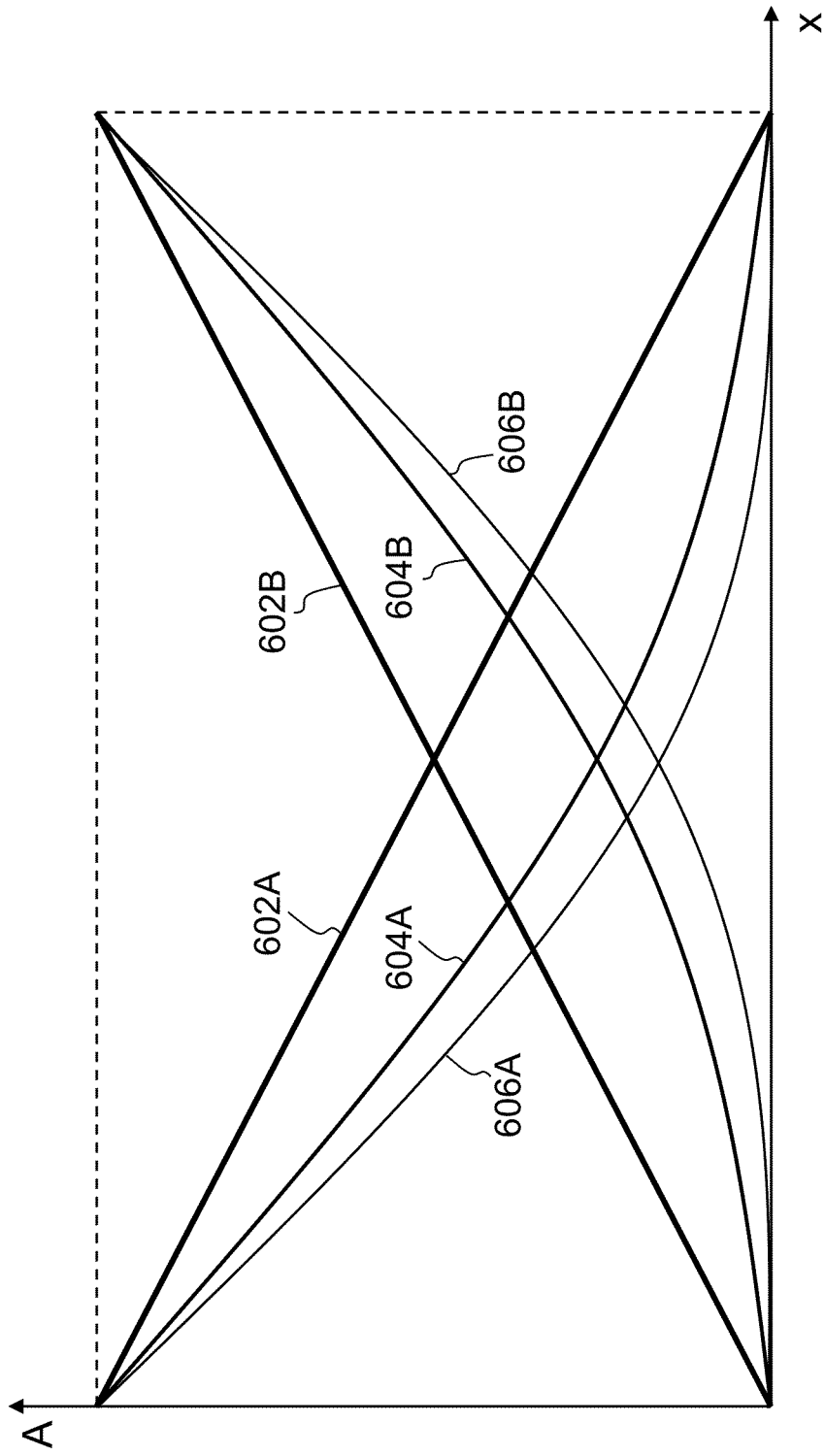
FIG. 6 is a qualitative graph illustrating example voltage gradients.

In accordance with the present invention, at least one of the gradients produced across transmitter electrode 520 is non-linear. In this regard, FIG. 6 is a qualitative graph depicting example voltage gradients, wherein the horizontal axis corresponds to physical length along an electrode from one end to an opposite end (e.g., ends 525 and 526 of FIG. 5), and the vertical axis corresponds to an amplitude of a signal (e.g., indicative of an amount of capacitive coupling) along the length of the transmitter electrode. FIG. 6 depicts, for example, a linear curve 602A and its inverse (i.e., laterally flipped) curve 602B, as well as example quadratic curves (604A, 604B) and example cubic curves (606A, 606B).

As used herein with respect to voltage gradients, the term "non-linear" refers to any category of curve that is not strictly linear (i.e., not characterized by a function of the form $y=mx+b$). For example, the non-linear voltage gradient might be a polynomial curve of degree greater than one (e.g., quadratic, cubic, etc.), a logarithmic curve, an exponential curve, or a trigonometric function (e.g., arctan, sin h, etc.). The voltage gradient may be continuous or discontinuous, and likewise may be differentiable (smooth) or non-differentiable. The voltage gradient may be a single function, or may consist of a plurality of monatomic piecewise segments.

Figure 7:
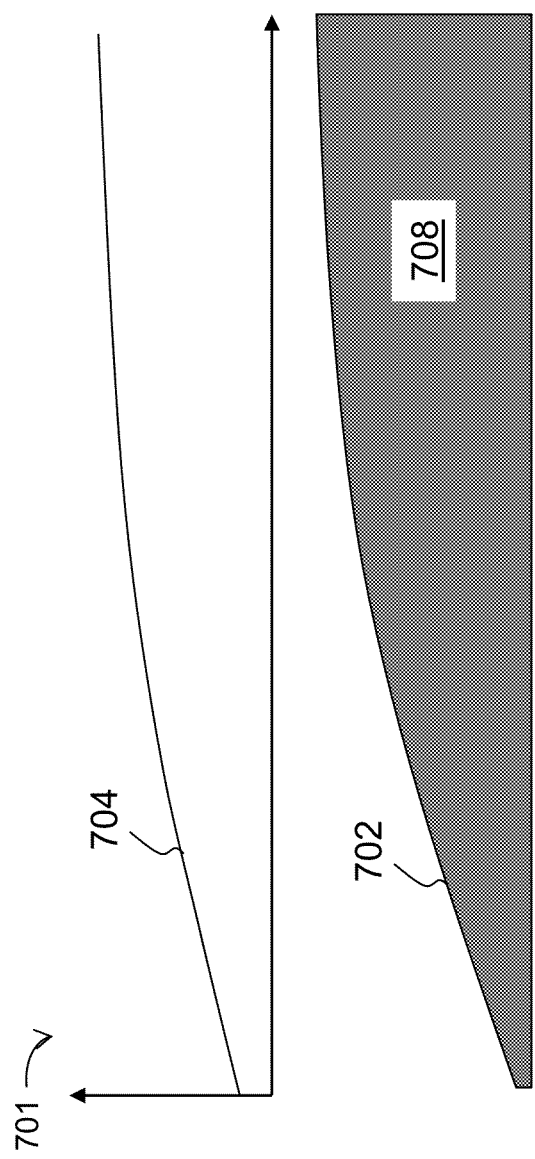
FIG. 7 depicts a transmitter electrode in accordance with one embodiment.

The shape of the voltage gradient may be produced in a number of ways. In some embodiments, for example, the shape of the voltage gradient has a shape that substantially corresponds to the shape of the transmitter electrode. That is, referring to FIG. 7, an electrode 708 may have a shape (e.g., the shape of edge 702) that substantially corresponds to a voltage gradient 704 (shown in qualitative graph 701). The non-linear nature of shape 702 gives rise to a correspondingly non-linear voltage gradient 704. Note that shape of voltage gradient 704 may not correspond exactly to the shape 702 of transmitter electrode 702 (e.g., voltage gradient 704 might be a scaled version, or the like). According to various embodiments, shape 702 may differ remarkably from, but still correspond to, the shape of voltage gradient 704.

In some embodiments, for example, the shape of the voltage gradient substantially corresponds to a material property of the transmitter electrode. That is, referring to FIG. 8, a transmitter electrode 808 as illustrated may have a substantially uniform thickness and width along its length, but has non-uniform resistivity due to nature of the transmitter electrode material itself (depicted by the lateral variation in greyscale darkness in the figure). For example, the transmitter electrode may include a mixture of materials having differing sheet resistivities such that the weight percentage of the materials varies in a known way across the length of the transmitter electrode.

Figure 8:
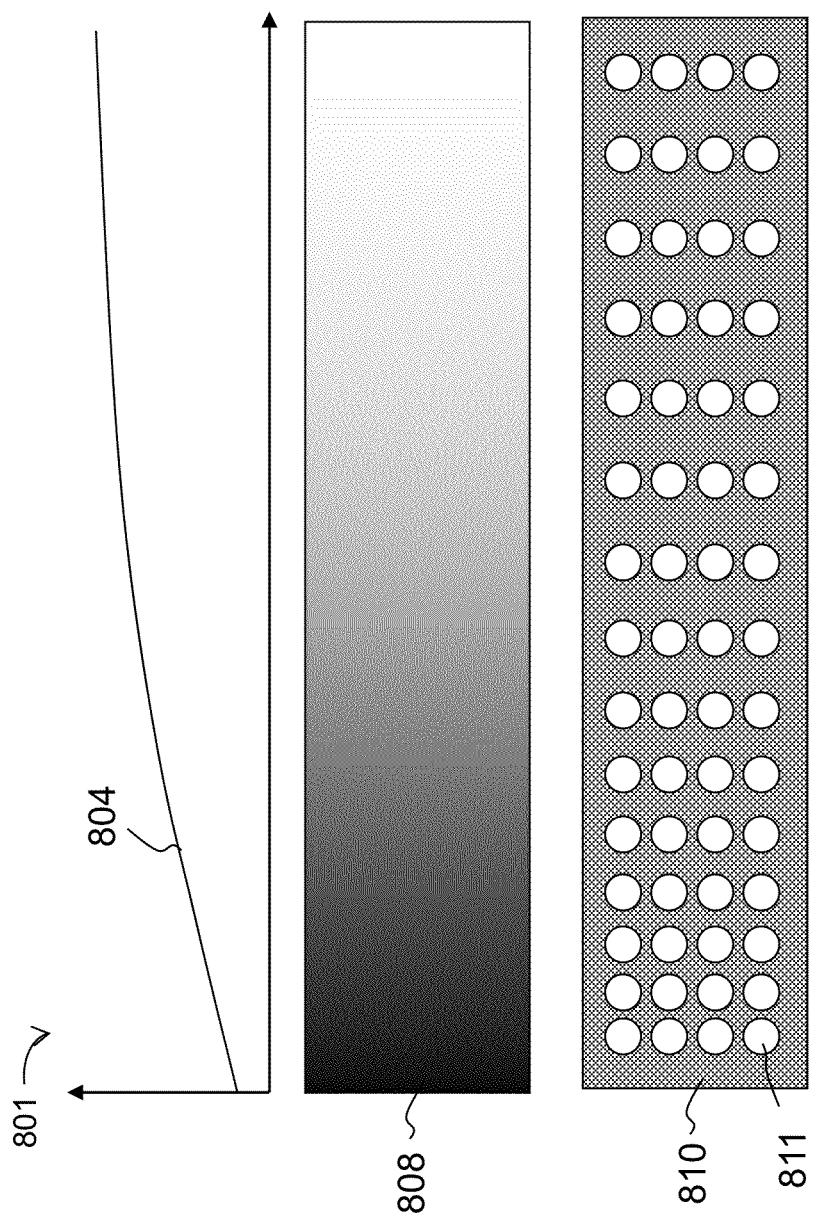
FIG. 8 depicts example transmitter electrodes in accordance with various embodiments.

In some embodiments, geometrical features (e.g., voids and the like) are incorporated along the transmitter electrode to affect the resistivity as a function of length along the transmitter electrode. That is, perforations of a constant, increasing, or decreasing size may be incorporated at increasing, decreasing, or constant density along the transmitter electrode. Transmitter electrode 810 illustrated in FIG. 8 depicts an example of such an embodiment wherein sets of equal-sized perforations 811 are distributed non-uniformly (i.e., increasing in distance from left to right) along transmitter electrode 810. Additionally, the transmitter electrode can comprise floating electrodes or ground electrodes.

Figure 9:
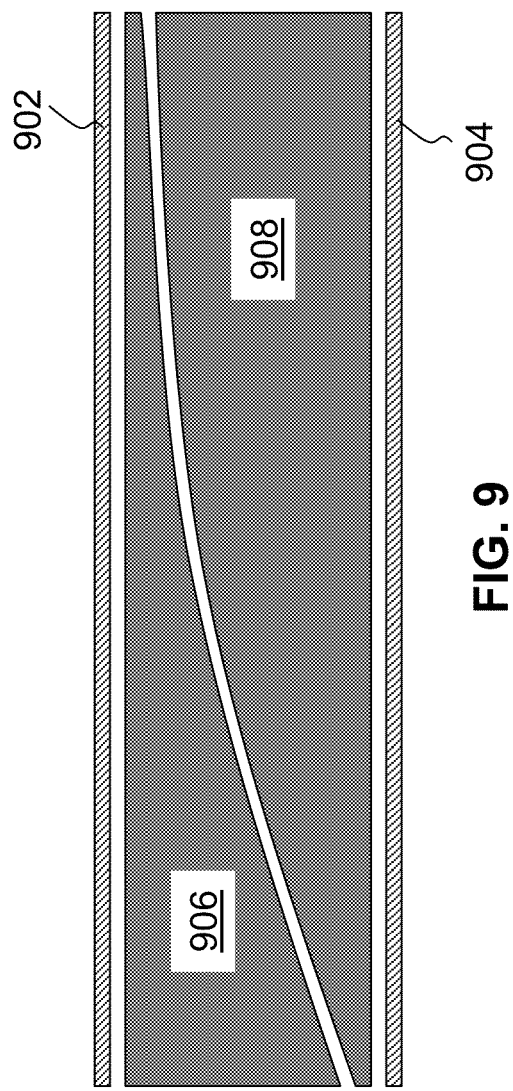
FIGS. 9-11 are conceptual diagrams depicting transmitter electrode configurations in accordance with various embodiments.
Figure 10:
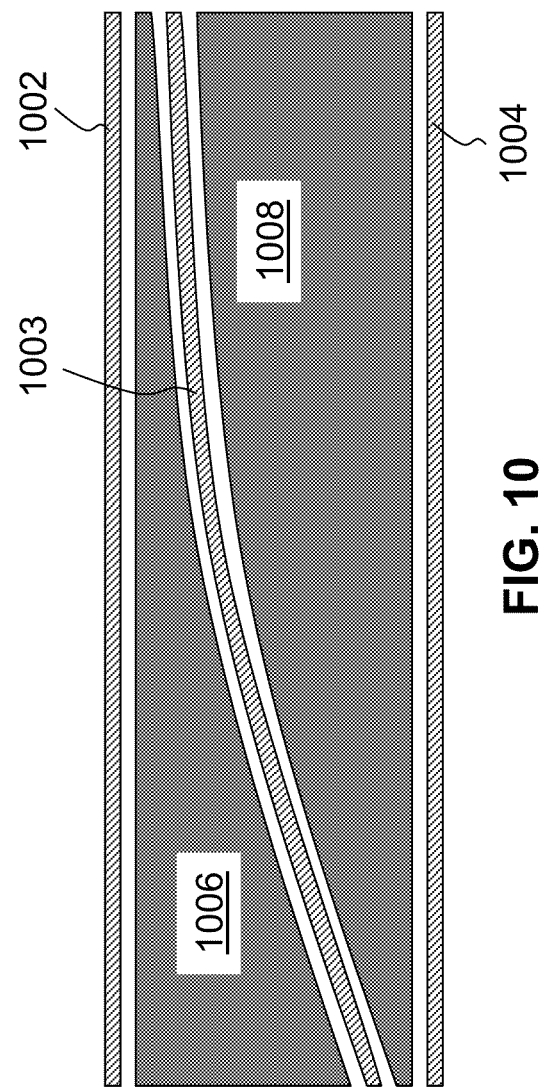
Figure 11:
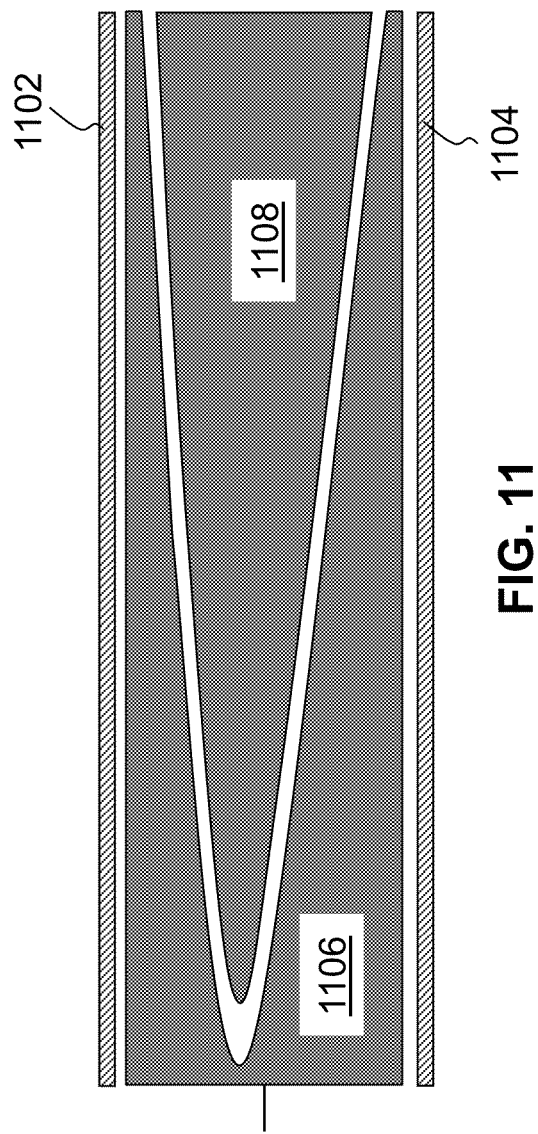

In some embodiments, the transmitter electrode is a single contiguous element; in others, however, the transmitter electrode comprises a plurality of transmitter electrodes. In this regard, FIGS. 9-11 show various transmitter electrode configurations incorporating two transmitter electrode elements. In FIG. 9, for example, two individually drivable transmitter electrode elements 908 and 906 provided between receiver electrodes 902 and 904 (a "split-electrode" configuration). The shapes of elements 906 and 908 may vary, as described above. Similarly, their respective voltage gradients may be produced by virtue of material property variation, rather than shape. Regardless, one element (906, 908) may be driven while the other is grounded or otherwise not driven, the elements may be driven sequentially, or both elements may be driven simultaneously. In this way, multiple non-linear gradients can be combined in various ways to approximate, e.g., a linear gradient when both gradients are driven simultaneously. Thus, for example, six different gradients can be produced from a pair of physical transmitter electrodes.

FIG. 10 shows a variation of the split-electrode embodiment depicted in FIG. 9, in which an additional receiver electrode 1003 (in addition to receiver electrodes 1002 and 1004) is placed between transmitter electrodes 1006 and 1008. The addition of receiver electrode 1003 assists in the acquisition of more accurate positional data by increasing the amount of signal captured due to the close proximity between the receiver 1003 and transmitters 1006 and 1008. FIG. 11 shows another embodiment wherein a generally trianguloid transmitter electrode element 1108 is encompassed on two sides by a corresponding concave transmitter electrode element 1106. A pair of receiver electrodes 1102 and 1104 are provided along opposite edges as in FIG. 9.

It will be appreciated that the embodiments shown in FIGS. 9-11 are merely provided for the purpose of illustration and are not intended to limit the number, shape, and/or configuration of elements that might be appropriate for any given application. Furthermore, in the interest of simplicity no electrical connections to the transmitter electrodes of FIGS. 9-11 have been illustrated. It will be understood, however, that connections to the transmitter electrodes will generally be made at their ends (e.g., on opposite ends) or at other points along the periphery of the transmitter electrodes.

Regardless of the particular configuration of transmitter and receiver electrodes, the non-linear nature of at least one of the voltage gradients makes it possible to determine the location of multiple input objects laterally along the transmitter electrode, based in part on the local change in capacitance induced by the proximity of the input objects within the sensing region. In one embodiment, the transmitter electrode is driven with a first drive signal and a second drive signal to produce corresponding first and second voltage gradients, wherein the first voltage gradient is a cubic polynomial and the second voltage gradient is a linear polynomial or a quadratic polynomial.

In another embodiment, four drive signals are used to produce corresponding voltage gradients, wherein one of the voltage gradients is linear and has a slope m, and the fourth voltage gradient is linear and has a slope −m (e.g., curves 602A and 602B in FIG. 6). In another embodiment, the first voltage gradient, the second voltage gradient, the third voltage gradient, and the fourth voltage gradient each have a shape corresponding to a respective polynomial of degree greater than or equal to one, and at least two of the degrees of the respective polynomials are different.

In general, when multiple input objects are present along a transmitter electrode within the sensing region, the response for each input object is a function of both the size of the input object (e.g., finger size) and position of the input object. Thus, multiple mathematically independent equations (i.e., voltage gradient shapes) are required in order to provide a unique mathematical solution and determine the state (size, position) of each input object. For example, one input object requires two mathematically independent equations, two input objects require four mathematically independent equations, and so on. In the interest of responsiveness and other factors, it is desirable that the equations be computationally convenient (e.g., analytical rather than numerical, easily invertible, etc.) and stable with respect to noise. That is, it is desirable that small differences in measured signal do not result in large changes in determined position.

Having thus given an overview of systems and methods for sensing multiple input objects in accordance with the present invention, a simplified derivation of an example method will now be provided. The derivation provided below relates to merely one particular case—i.e., the combination of linear, quadratic, and cubic voltage gradients. As noted above, however, a variety of combinations of mathematically independent equations may be used.

In accordance with a particular embodiment (i.e., two input objects), it is assumed that a set of four responses P, Q, R, and S correspond to the sizes and positions of two input objects at locations $x_0$ and $x_1$ along the transmitter electrode, and that the responses are described generically by functions designated as $f$, $g$, and $h$, such that:

$$\begin{cases} P = Af(x_0) + Bf(x_1) \\ Q = Af(1-x_0) + Bf(1-x_1) \\ R = Ag(x_0) + Bg(x_1) \\ S = Ah(1-x_0) + Bh(1-x_1) \end{cases} \quad (1)$$

In equation 1, the position along the transmitter electrode ranges from 0.0 to 1.0, and thus the $(1-x_0)$ and $(1-x_1)$ terms may be conveniently used. The factors A and B are proportional to the sizes of input objects, and thus can be eliminated from the first two equations as so:

$$A = \frac{Qf(x_1) - Pf(1-x_1)}{f(1-x_0)f(x_1) - f(x_0)f(1-x_1)} \quad (2)$$

$$B = \frac{Pf(1-x_0) - Qf(x_0)}{f(1-x_0)f(x_1) - f(x_0)f(1-x_1)}$$

In a particular case, $f$ is the identity function (a linear response) and thus equations 2 become:

$$A = \frac{Qx_1 - P(1-x_1)}{x_1 - x_0} \quad (3)$$

$$B = \frac{P(1-x_0) - Qx_0}{x_1 - x_0}$$

Assuming that the third equation above (for R) is described by a second order polynomial, and the fourth equation (for S) is described by a third order polynomial, then:

$$R = \frac{[(P+Q)x_1 - P]x_0^2 - [(P+Q)x_0 - P]x_1^2}{x_1 - x_0} \quad (4)$$

$$S = \frac{Qx_1 - P(1-x_1)}{x_1 - x_0}x_0^3 + \frac{P(1-x_0) - Qx_0}{x_1 - x_0}x_1^3 \quad (5)$$

Combining equations 4 and 5, it can be shown that:

$$S = P\left((x_1 + x_0)^2 - \frac{P(x_1+x_0) - R}{P+Q}\right) - (P+Q)\frac{P(x_1+x_0) - R}{P+Q}(x_1 + x_0) \quad (6)$$

Since the unknown in equation 6 is the sum of the two x values, with the notation $x_0 + x_1 \equiv \Theta$ this can be rewritten as:

$$S = P\left(\Theta^2 - \frac{P\Theta - R}{P+Q}\right) - (P+Q)\frac{P\Theta - R}{P+Q}\Theta \quad (7)$$

or:

$$S = \frac{-P^2\Theta + PR + PR\Theta + QR\Theta}{P+Q} \quad (8)$$

And since $x_0 + x_1 \equiv \Theta$:

$$\Theta \equiv x_0 + x_1 = \frac{P(R-S) - QS}{P(P-R) - QR} \quad (9)$$

From equations 9 and 4, it can be shown that:

$$\Phi \equiv x_0 x_1 = \frac{R^2 - PS}{P(P-R) - QR} \quad (10)$$

And thus, from equations 9 and 10, it is possible to extract the positions ($x_0$ and $x_1$) of the two input objects as follows:

$$x_{0,1} = \frac{\Theta \pm \sqrt{\Theta^2 - 4\Phi}}{2}$$

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

The invention claimed is:

1. A gradient sensor device comprising:
    a transmitter electrode;
    a receiver electrode; and
    a processing system communicatively coupled to the transmitter electrode and the receiver electrode, the processing system configured to:
        drive the transmitter electrode with a first drive signal to produce a first voltage gradient across the transmitter electrode, wherein the first voltage gradient is non-linear;
        drive the transmitter electrode with a second drive signal to produce a second voltage gradient;
        drive the transmitter electrode with a third drive signal to produce a third voltage gradient;
        drive the transmitter electrode with a fourth drive signal to produce a fourth voltage gradient;
        receive a resulting signal with the receiver electrode, the resulting signal comprising effects of the first voltage gradient, the second voltage gradient, the third voltage gradient, and the fourth voltage gradient; and
        determine positional information for a plurality of input objects located simultaneously within a sensing region along the transmitter electrode based on the resulting signal,
        wherein the first voltage gradient, the second voltage gradient, the third voltage gradient, and the fourth voltage gradient each have a shape corresponding to a respective polynomial of degree greater than or equal to one, and
        wherein at least two of the degrees of the respective polynomials are different.

2. The gradient sensor device of claim 1, wherein the transmitter electrode comprises a first electrode element and a second electrode element.

3. The gradient sensor device of claim 2, wherein the receiver electrode is located between the first electrode element and the second electrode element.

4. The gradient sensor device of claim 1, wherein the first voltage gradient has a shape corresponding to the shape of the transmitter electrode.

5. The gradient sensor device of claim 1, wherein the first voltage gradient has a shape corresponding to a material property of the transmitter electrode.

6. The gradient sensor device of claim 1, wherein the first voltage gradient is a cubic polynomial, and the second voltage gradient is selected from the group consisting of a linear polynomial and a quadratic polynomial.

7. A processing system for an input device, the processing system comprising:
    a transmitter module including transmitter circuitry, the transmitter module configured to:

drive a transmitter electrode with a first drive signal to produce a first voltage gradient across the transmitter electrode, wherein the first voltage gradient is non-linear, drive the transmitter electrode with a second drive signal to produce a second voltage gradient, drive the transmitter electrode with a third drive signal to produce a third voltage gradient, and drive the transmitter electrode with a fourth drive signal to produce a fourth voltage gradient, wherein the first voltage gradient, the second voltage gradient, the third voltage gradient, and the fourth voltage gradient each have a shape corresponding to a respective polynomial of degree greater than or equal to one, and wherein at least two of the degrees of the respective polynomials are different;

a receiver module, the receiver module configured to receive a resulting signal with a receiver electrode, the resulting signal comprising effects of the first voltage gradient, the second voltage gradient, the third voltage gradient, and the fourth voltage gradient; and a determination module determining positional information for a plurality input objects located simultaneously within a sensing region along the transmitter electrode based on the resulting signal.

8. The processing system of claim 7, wherein the first voltage gradient is a cubic polynomial, and the second voltage gradient is selected from the group consisting of a linear polynomial and a quadratic polynomial.

9. The processing system of claim 7, wherein the third voltage gradient is linear and has a slope m, and the fourth voltage gradient is linear and has a slope –m.

10. A method of capacitive sensing, the method comprising:

driving a transmitter electrode with a first drive signal to produce a first voltage gradient across the transmitter electrode, wherein the first voltage gradient is non-linear;

driving the transmitter electrode with a second drive signal to produce a second voltage gradient;

driving the transmitter electrode with a third drive signal to produce a third voltage gradient;

driving the transmitter electrode with a fourth drive signal to produce a fourth voltage gradient;

receiving a resulting signal with a receiver electrode, the resulting signal comprising effects of the first voltage gradient, the second voltage gradient, the third voltage gradient, and the fourth voltage gradient; and determining positional information for a plurality input objects located simultaneously within a sensing region along the transmitter electrode based on the resulting signal, wherein the first voltage gradient, the second voltage gradient, the third voltage gradient, and the fourth voltage gradient each have a shape corresponding to a respective polynomial of degree greater than or equal to one, and wherein at least two of the degrees of the respective polynomials are different.

11. The method of claim 10, wherein the first voltage gradient is a cubic polynomial, and the second voltage gradient is selected from the group consisting of a linear polynomial and a quadratic polynomial.

* * * * *